Figure 3B:
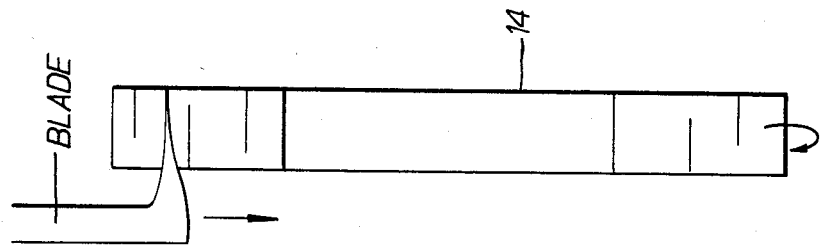

United States Patent [19]

Brettle et al.

[11] Patent Number: 4,594,472
[45] Date of Patent: Jun. 10, 1986

[54] CONDUCTIVE GASKETS

[75] Inventors: Jack Brettle, Greens Norton; Kevin J. Lodge, Brackley; Nicholas J. Loggie, West Wycombe; Simon M. P. Hughes, Abbey Chase; William G. Howell, Greens Norton, all of United Kingdom

[73] Assignee: Plessey Overseas Limited, Ilford, England

[21] Appl. No.: 546,579

[22] Filed: Oct. 28, 1983

[30] Foreign Application Priority Data

Oct. 29, 1982 [GB] United Kingdom ................. 8231038
Apr. 26, 1983 [GB] United Kingdom ................. 8311332

[51] Int. Cl.$^4$ ............................................. H05K 9/00
[52] U.S. Cl. ............................ 174/35 GC; 174/35 MS
[58] Field of Search .................... 174/35 MS, 35 GC; 277/DIG. 6, 227, 901; 428/367, 902; 264/108, 159, 172

[56] References Cited

U.S. PATENT DOCUMENTS

| 2,674,644 | 4/1954 | Goodloe | 174/35 GC |
| 2,885,459 | 5/1959 | Pulsifer et al. | 174/35 GC |
| 2,992,425 | 7/1961 | Pratt | 174/35 MS |
| 3,126,440 | 3/1964 | Goodloe | 174/35 GC |
| 3,328,501 | 6/1967 | Barnett | 264/108 |
| 4,102,831 | 7/1978 | Osgood | 264/108 |
| 4,132,828 | 1/1979 | Nakamura et al. | 428/367 X |
| 4,243,460 | 1/1981 | Nagler | 174/35 GC X |
| 4,252,990 | 2/1981 | Sado | 174/35 GC X |
| 4,288,081 | 9/1981 | Sado | 174/35 GC X |
| 4,309,479 | 1/1982 | Naruse et al. | 428/367 X |
| 4,364,993 | 12/1982 | Edelman et al. | 428/367 X |
| 4,443,517 | 4/1984 | Shah | 428/367 X |
| 4,471,015 | 9/1984 | Ebneth et al. | 174/35 MS X |
| 4,481,249 | 11/1984 | Ebneth et al. | 428/902 X |

FOREIGN PATENT DOCUMENTS

| 0007701 | 2/1980 | European Pat. Off. . | |
| 0043040 | 1/1982 | European Pat. Off. . | |
| 0090151 | 10/1983 | European Pat. Off. . | |
| 2827676 | 1/1979 | Fed. Rep. of Germany . | |
| 56684 | 5/1979 | Japan | 264/108 |
| 27480 | 7/1980 | Japan | 174/35 MS |
| 35319 | 8/1981 | Japan | 174/35 MS |
| 2098808 | 11/1982 | United Kingdom . | |

Primary Examiner—Laramie E. Askin
Assistant Examiner—Morris H. Nimmo
Attorney, Agent, or Firm—Fleit, Jacobson, Cohn & Price

[57] ABSTRACT

A conductive gasket for use in electro magnetic interference protection of electrical apparatus comprises an elastomeric material in which high aspect ratio conductive fibres are embedded to provide the conductive paths across the gasket. Preferably the fibres are carbon fibres.

13 Claims, 6 Drawing Figures

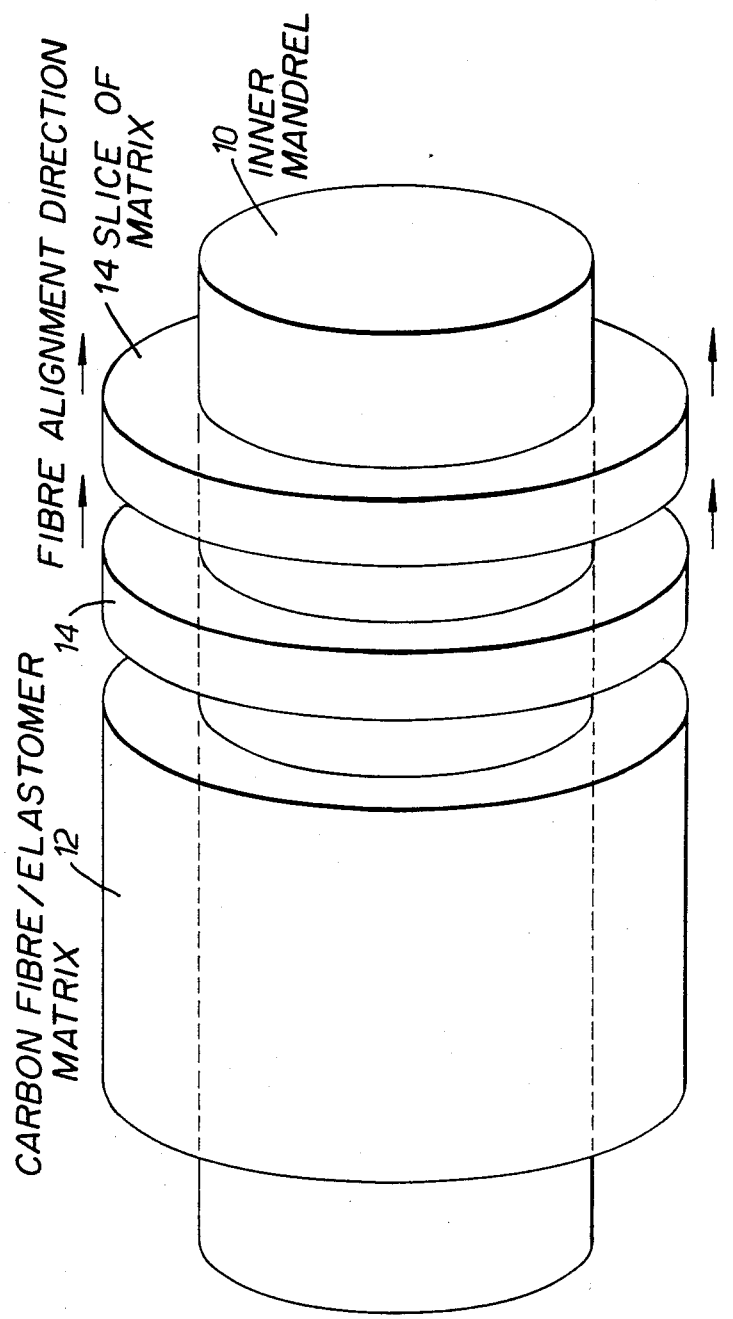

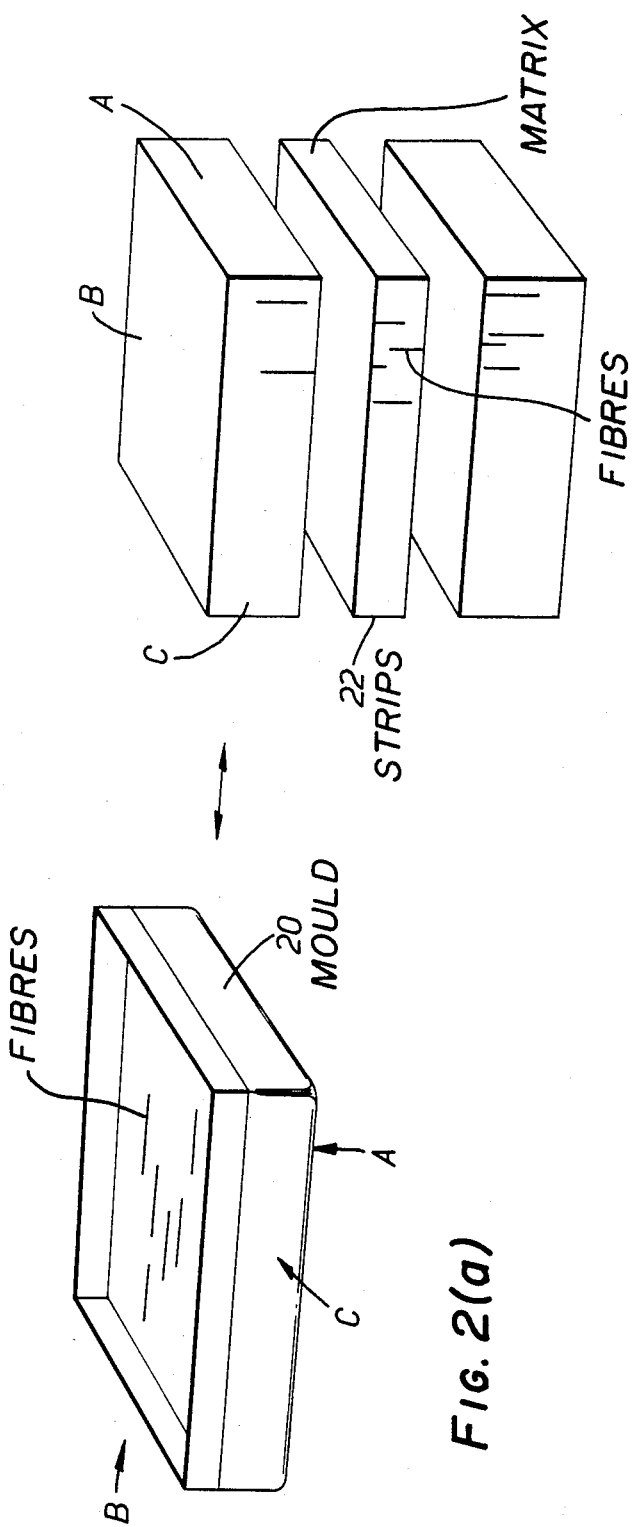

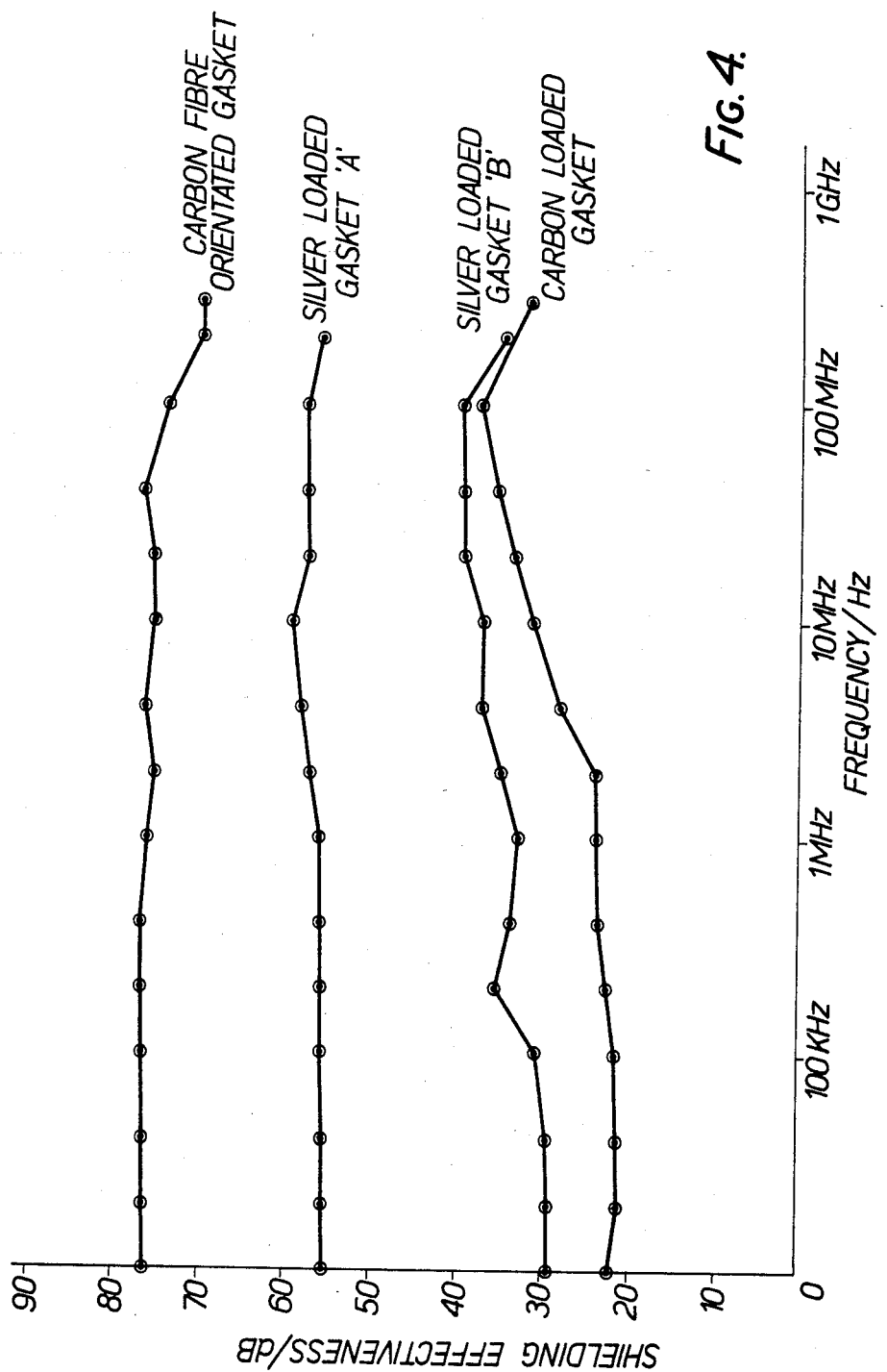

CONDUCTIVE GASKETS

The present invention relates to conductive gaskets, and more particularly to gaskets for prevention of electromagnetic interference (EMI) to electrical equipment within an enclosure.

EMI gaskets are used for the sealing of joints between mating surfaces where the penetration of electromagnetic or electrostatic energy must be prevented. Often, as well as this requirement, the gasket must also act as a weatherseal between the mating surfaces. The traditional methods of attaining these requirements are by using an elastomeric material incorporating conductive particles, distributed through its volume, either as conductive particles loaded into the elastomer or wires across the gasket.

There are however several inherent problems with these types of gaskets. For the gaskets which contain metal wires there are often problems of electrochemical compatibility from a corrosion point of view, as well as the life of the gasket being reduced due to deformation of the wire causing loss of contact to the mating surfaces. High loadings of the conductive particles have to be used in order to obtain good electrical properties. A common filler is silver, used in order to get high conductivity (typically in the order of 30 S/m in the plane at right angles to the mating surfaces and 9000 S/m in the plane of the mating surfaces). The use of silver however means that the gasket is expensive and also relatively heavy in weight, which is not desirable for use in aircraft access doors which was envisaged to be the immediate application of this invention. If carbon particles are used then particle interface resistances are high, so giving poor conductivities (typically 0.04 S/m in the plane at right angles to the mating surfaces and 4 S/m in the plane of the mating surfaces).

All of these types of gasket are made up of conducting elements that are either particulate, flakes or wires. The wires can contact in one direction only, because of their method of alignment in the elastomer matrix; therefore both ends of a wire must be in contact with the respective mating surfaces for there to be any contribution from a wire. For particulate or flake conducting elements, for a conduction path to be constructed the conducting elements must have at least two contacts with other conducting elements for current to pass through them. The chances of these two contact points arising increases when the aspect ratio of the conducting elements increases. Thus high loadings of flake or particulate conducting elements are needed in order for conduction paths to be constructed since their aspect ratio is very low.

It has been found however that if long fibres, which have a high aspect ratio, are used then these conduction paths may be constructed more easily with lower loadings.

The present invention therefore provides a conductive gasket for prevention of EMI interference to electrical equipment within an enclosure and in which the gasket is formed from an elastic material and in which conductive paths are present within the gasket, said conductive paths being formed from high aspect ratio conductive fibres.

The present invention also provides a method of manufacturing conductive gaskets in which an elongate inner mandrel is surrounded by an elongate outer mould, in which the space between the mandrel and mould is filled with a mixture of elastomer, curing agent and carbon fibres, the carbon fibres being preferably orientated along the length of the mandrel, in which the mixture is cured and the outer mould removed and in which gaskets are obtained by cutting through the set mixture in a direction orthogonal to the longitudinal axis of the mandrel.

In a preferred embodiment the fibres are carbon fibres, and possibly metal coated and upper and lower conductive layers may be provided on the gasket.

Embodiments of the present invention will now be described with reference to the accompanying drawings in which.

Figure 3A:
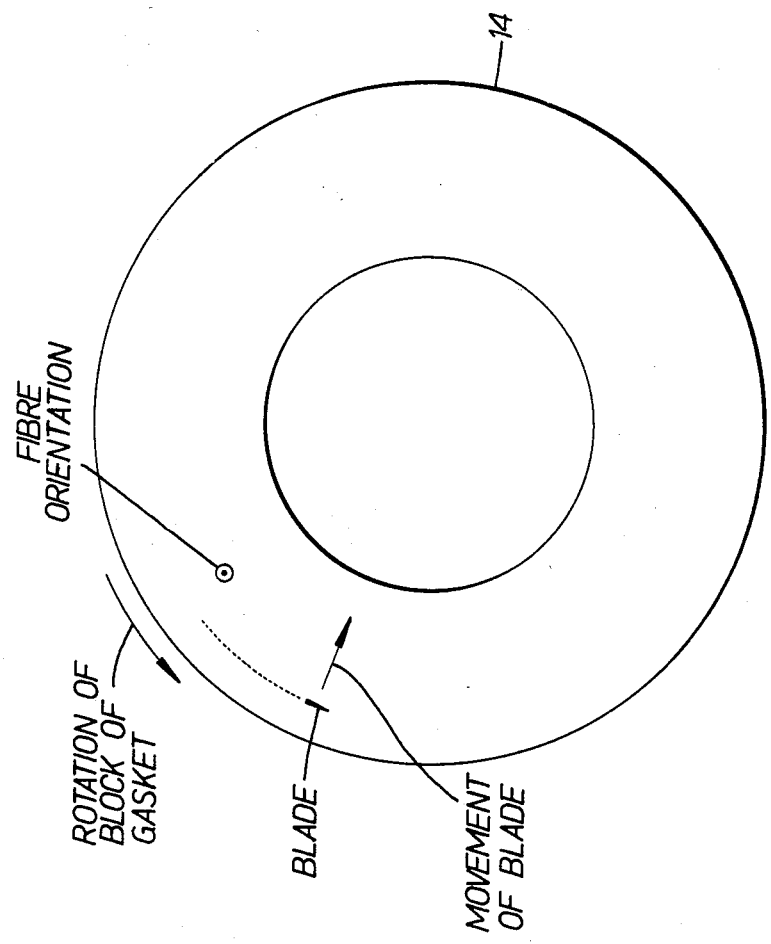

FIG. 1 shows a first moulding method illustrating the inner mandrel and gaskets removed therefrom, FIGS. 2a and 2b show a second moulding method, FIGS. 3a and 3b show a third moulding method and FIG. 4 shows a graph illustrating effective shielding against frequency.

The present invention uses carbon fibres, which may or may not be metal coated (e.g. with silver, tin, nickel or copper), as a method of improving conductivity by virtue of their greater aspect ratio which leads to better likelihood of contact between fibres. Whilst this can give extremely good conductivity values in the plane of the mating surfaces (up to 2000 S/m for a 5% loading of carbon fibres), this may not give good enough conductivity in the plane perpendicular to the mating surfaces (only 5 S/m for a 5% loading of carbon fibres). This is because the fibres align themselves in the plane of the mating surface due to the nature of the mixing and curing of the gasket. Therefore some sort of surface pretreatment is preferable in order to improve conductivity in this plane.

In a first embodiment to provide this improved conductivity special surface layers or treatments are used over the chopped fibre and elastomer mixture. These surface layers may be made from knitted carbon fibre cloth, ordinary woven carbon fibre cloth, carbon fibre felt, carbon fibre paper etc. in either coated or uncoated form. This gives high conductivity values, for example carbon fibre knitted cloth over copper coated fibres give values of 18.6 S/m at right angles to the plane of the mating surfaces and 1215 S/m in the plane of the mating surfaces. The gasket invented is lightweight, relatively cheap compared to silver particle loaded gaskets and also has excellent electrochemical compatibility from a corrosion standpoint with carbon fibre composite materials.

The aspect ratio of the fibres used in this type of gasket is critical. In order to get good mixing the fibre length is preferably less than approximately 10 mm but not small enough to lose the advantages of the aspect ratios of fibres. A preferred minimum length of ½ mm has been found to give good results.

The preferred range for the diameter of the fibres is between 5 to 20 microns, a diameter of 7 microns being found to give good practical results. Fibres with diameters of up to 200 microns can however be used in specific applications. Metal plating is applied very thin to add only 1 to 4 microns to the fibre diameter.

The mixing of the fibres, elastomer and curing agent is in practice critical. The shorter the mixing time, provided that good distribution is obtained of both fibre and curing agent, the better electrical properties the gasket possesses. The reason for this is that the fibres tend to be broken by the mixing process, especially where a particularly thick elastomer is used for example for a hard gasket for use between surfaces that are to be bolted together.

The mixture may also contain filler powder to add to the stiffness of the finished gasket and also dyes if necessary to give the finished colour. In such cases the filler, elastomer and dye can be mixed to a good consistency prior to the addition of the curing agent and fibre to reduce the mixing time during which the fibre is present.

In addition to the curing agent a blowing agent may be added to produce a gasket with air bubbles throughout its width. Such a gasket will be much more easily compressed than one without air bubbles.

In a first example, to produce a gasket wih a Shore A hardness of 55 the elastomer selected was SYLGARD 170 which has a viscoscity of between 1500 and 4000 Centipoises. The elastomer was mixed at a ratio of 1:1 with the curing agent and with 5% by weight of 7 mm carbon fibre. The mixing time was 5 minutes at a speed of 60 to 120 revolutions per minute. The resultant mixture was used to manufacture gaskets with a Shore A hardness of approximately 55 as described hereinafter.

In a second example to produce a gasket with a Shore A hardness of approximately 25 the elastomer chosen was RHORDORSIL R.T.V. 581 which has an initial viscoscity of 20,000 Centipoises. This was mixed as directed with a curing agent at a ratio of 100:3 and with 5% of 7 mm carbon fibre at a speed of between 60 to 120 revolutions per minute for 3 minutes. The resulting mixture was used to make gaskets as described hereinafter.

It is also possible to mix different lengths of the fibres in the elastomer matrixes as described above in order to obtain electrical cross linking and electrical properties in the plane at right angles to the mating surfaces. The loading found to be most suitable and that which has been used for the conductivity values given above have been between 4–7% by weight. For longer fibres it is possible to use down to 2% and by use of additives up to 10% carbon fibre can be added.

The possibility also exists of treating the gasket by sand or shot blasting the surfaces of it. This would serve to remove excess elastomer from the surfaces of the gasket and thus expose the fibres below which may or may not be plated. An alternative treatment to this would be to roughen the inside surfaces of the mould in which the gasket is made. This would have the same result as blasting the surfaces of the gasket.

The outside surface of the gasket could incorporate a "bleed" cloth which can be subsequently torn off to expose the carbon fibres at the surface. The electrical properties are dependent on the surface finish of the cloth, the thickness and absorbent quality. For example a fibre glass, or metallised cloth could be used.

The carbon fibre surface layers described hereinbefore as paper, cloth or mat may be metal coated in their semifinished form before incorporation into the gasket (rather than individal fibres coated). Metal coating in this way holds the fibres together and further improves electrical contact.

Surface layers could be made up from carbon fibres coated with different metals on either side of the gasket. This has the advantages of galvanic compatibility to overcome corrosion effects when galvanically incompatible structures are to be gasketted together, e.g., carbon fibre composite hatch cover in an aluminium alloy hatch surround. In this case an unplated carbon fibre surface layer on the gasket would contact the composite surface and a tin plated carbon fibre layer the aluminium surface. In this way the galvanic interface is transferred to the interior of the gasket where it is unimportant as water is not able to reach it.

The interior of a gasket may be filled with other carbon fibre materials besides chopped fibre. The important factor is to obtain structures where a high percentage of fibres travel in the "through thickness" direction to achieve maximum conductivity. Three dimensional woven material or velvet material could be used in such an application but would need to be impregnated with maxtrix rubber rather than the mixing process earlier described.

Carbon fibre fillers may be used in "seal in place gaskets". These are thin layers of (usually) polysulphide rubber which are squeezed onto a surface from a caulking gun and when the surface is closely fitted to another, e.g., in skin panel jointing on an aircraft, forms a thin layer of sealant. There are many cases where it would be advantageous for this layer to be electrically conductive and carbon fibre fillers are a method of achieving this.

The material is much stiffer than the parent elastomer matrix in all dimensions due to the inherent stiffness of the carbon fibre filler. With even flow patterns this inherent stiffness is distributed throughout the material and relatively low loadings (about 5% by weight) can have considerable effects on the elastomeric properties of the material. Qualitative tests have shown that the incorporation of the carbon fibre into the material produces a material that has good mechanical recovery, that is to say that when the material is deformed by pressure it will retake its original dimensions quickly when the pressure is released. This has been found to be the case if the pressure is applied uniformly over the surface of the material, or locally where pressure is applied to only one part of the material.

The surface layers of carbon fibre materials improves this situation for pressure that is applied on those surfaces where a carbon fibre surface is present. Again this is due to the inherent stiffness of the carbon fibres but also because as the material is linked in either a cloth or knitted cloth fashion it will distribute pressure that is applied locally.

The advantages of such a material apart from the electrical ones are that it provides a gasket that will withstand high closing forces and be able to recover when the force is released so that replacement of the gasket is not necessary for good integrity to be achieved when the closing force is reapplied. This also has electrical advantages, as well, in the sense that the gasket will make good electrical contact when the closing force is reapplied as the material will have recovered whereas if it had not recovered contact would be lost.

By tailoring the fibre length with the width and height of the material these properties may be exploited so that weatherseals may be more efficient and with further tailoring these properties could be exploited for use for E.M.I. gaskets as weatherseals as well.

Methods of manufacturing gaskets will now be described with reference to FIGS. 1 to 4.

With reference to FIG. 1 there is shown a mould with an inner mandrel 10 surrounded by an outer dimension mould (not shown) with the space being filled with the carbon fibre/elastomer matrix 12. The inner mandrel sets the inner dimensions of the gasket. The material is fed into the space from one end between the inner and outer mould such that the fibres align themselves in the direction of the arrows. By moulding a block of this material then slices 14 of the material may be taken when the system has been cured and gaskets of desired thickness can be obtained. The inner mandrel 10 may be any shape from circular through to complicated shapes for specific purposes. The same is also applicable to the outer dimension mould (not shown). This method allows the orientation of the fibres to be such that they are at right angles to the plane of the mating surfaces. When cut the gasket surfaces in the plane of the mating surfaces feel textured. This is due to the fibres protruding from these surfaces and it is these fibres that make electrical contact to the mating surfaces. It is possible that different cutting techniques could affect the average length of fibre that protrudes from the surfaces and this therefore could be tailored to end use. For instance, it is believed that water jet cutting may be tailored such that this can occur.

There are two alternative methods of producing the material with the fibres in the correct orientation. The first of these methods is to put the mixture into a shallow mould 20 in which the natural orientation of the fibres will be horizontal and when cured the sheet is removed from the mould and cut into strips 22 along its length (FIGS. 2(a) and 2(b)) thus obtaining strips which when turned through 90° have the fibres in the right orientation. Greater control of fibre direction could be obtained by directional feeding of the mixture from one end of the mould or by combing the mixture prior to setting. The strips and thickness of the mould may be tailored so that dimensions of the final strip of gasket are suitable for specific applications.

The second main method of obtaining strips of the gasket material is to take a slice 14 of the material made in FIG. 1 as shown in FIGS. 3(a) and 3(b). By cutting from the outside inwards describing a spiral a long strip of material is produced. Again the cutting and moulding parameters may be tailored to suit specific applications.

It has been found that with low loadings of carbon fibres very good electrical conductivity may be achieved. A preferred system that has been tested comprises nickel plated carbon fibres (5% by weight loading) in silicone matrices. This system was found to have electrical conductivity in the plane at right angles to the mating surfaces of about 400 S/m (greater than ten times that of the best silver loaded gasket measured).

Using a co-axial short fixture which is proposed S.A.E. standard (Madle P.J.m "Test procedure to measure the transfer impedance of gasketted joints for shielded enclosures" S.A.E. Committee AE4, San Diego Oct. 8th 1979), shielding effectivenesses of various filled elastomers are given in FIG. 4.

As well as having excellent electrical and R.F. shielding properties the hardness of the gasket may be tailored to the specific use of the application. This may be done in one of several ways. First the hardness of the elastomer matrix may be altered and this will make the resultant gasket harder or softer depending on the parent elastomer hardness. The second way is to alter the loading of the carbon fibres although this will effect the electrical properties of the gasket, which may be undesirable. The third method is to add fillers other than carbon fibres to the system such as silica which has an effect of making the gasket harder. It is also possible to incorporate gas filled voids to produce a more compressible gasket.

If it is required to have a hard gasket by using hard silicone, silica is added in a low percentage by weight and the loading of carbon fibres is maximised, the rubber shows good creep resistance and a Shore A hardness of about 75 may be achieved.

Even when the loadings are high the gasket has the advantage of being light weight especially when compared with silver loaded gaskets. This is very advantageous for applications where weight is important such as in the aerospace industry and with man-portable equipment.

By being sufficiently elastomeric the gaskets also act as a weatherseal. The closing force must however be relatively high if the hardness of the rubber is high. As part of the gasket is liable to be exposed to the external environment it is important that the electrochemical compatibility of the gasket is closely matched to that of the mating surfaces. This may be achieved as outlined above by plating the carbon fibres in a suitable metal that is compatible with the material of the mating surfaces. For carbon fibre composite materials the plating would not be necessary and unplated carbon fibre could be used.

As an alternative to using silicone rubber it would be possible to use other elastomers. For instance flourosilicone or nitrile rubbers could be used. This gives the resultant gasket much better protection against attack by solvent, such as there might be on the external environment of the aircraft.

There exists the possibility that as well as being an electrically conducting gasket these materials may also be used as thermally conducting gaskets. The thermal conductivity of both the metal plating and the carbon fibre are good and the gasket may well be useful in this capacity for transferring heat to a suitable heat sink.

We claim:

1. A conductive gasket for prevention of EMI interferences to electrical equipment within an enclosure, the gasket having spaced sides for contacting opposed surfaces between which a conductor path is to be provided, the gasket comprising an elastic material in which conductive paths extend from one spaced side of the gasket to the other, said conductive paths each being formed by a plurality of high aspect ratio conductive fibres aligned substantially at right angles to the sides of the gasket.

2. A conductive gasket as claimed in claim 1 in which the high aspect ratio conductive fibres are carbon fibres.

3. A conductive gasket as claimed in claim 1, in which a surface conductive layer is provided on each side of the gasket to improve conductivity from one side of the gasket to the other side.

4. A conductive gasket as claimed in claim 2 in which the carbon fibres are in the range 5 to 20 microns diameter and ½ to 10 mm in length.

5. A conductive gasket as claimed in claim 3 in which the conductive layers are selected from the group consisting of paper, cloth and mat materials which are metal coated.

6. A gasket as claimed in claim 3, wherein the surface conductive layers are comprised of metal coated fibres.

7. A conductive gasket for prevention of EMI interference to electrical equipment within an enclosure, the gasket having spaced sides for contacting opposed surfaces between which a conductor path is to be provided and being formed from an elaastic material in which conductive paths extend between the spaced sides of the gasket, said conductive paths each being formed by a plurality of metal coated, high aspect ratio conductive carbon fibres.

8. A conductive gasket for prevention of EMI interference to electrical equipment within an enclosure, the gasket having spaced sides for contacting opposed surfaces between which a conductor path is to be provided and being formed from an elastic material in which conductive paths extend between the spaced sides of the gasket, said conductive paths each being formed by a plurality of high aspect ratio conductive carbon fibres, the carbon fibres comprising between 4 to 7% of the weight of the gasket.

9. A conductive gasket comprising:
   a matrix of elastomer material having a pair of sapced sealing surfaces; and
   a multiplicity of high aspect ratio conductive fibres incorporated in said matrix, each fibre having a longitudinal axis oriented at substantially right angles to said pair of spaced sealing surfaces of said gasket, the fibres being of a number sufficient to provide a multiplicity of conductive paths through said matrix, each path extending from one sealing surface to the other and each path formed by a plurality of the fibres.

10. A gasket as claimed in claim 9, wherein the fibres are cross-linked by conductive fibres of a different length.

11. A conductive gasket for prevention of EMI interference to electrical equipment within an enclosure, the gasket having spaced sides for contacting opposed surfaces between which a conductor path is to be provided and being formed from an elastic material in which conductive paths extend between the spaced sides of the gasket, said conductive paths each being formed by a plurality of high aspect ratio conductive fibres, and wherein surface conductive layers are provided in at least a first layer and a second layer, respectively, one on each side of the gasket to improve conductivity, each said surface conductive layer being comprised of carbon fibres coated with metal, said first layer including fibres coated with a first metal and said second layer including fibres coated with a second metal different from said first metal, respectively.

12. A method of manufacturing a conductive gasket including the following steps:
   mixing elastomer, filler and dye;
   adding to this mix, curing agent and between 4 and 7% by weight of conductive fibres each having a diameter in the range of from 5 to 20 microns;
   mixing further for a period of time sufficiently short to provide even distribution of the fibres, and to provide fibres predominantly of length in the range of from ½ to 10 mm;
   extruding the resulting mixture into a mould defined by an inner mandrel having an axis and an elongate outer mould casing having an inner surface spaced from the mandrel, to align the fibres lengthwise in a direction parallel to the axis of the mandrel;
   curing the mixture;
   removing the outer mould casing; and
   cutting the moulded piece thus formed in a direction orthogonal to the axis of the mandrel.

13. A method as claimed in claim 12, including as a subsequent step, abrading the cut surfaces of the moulded piece to expose fibres located adjacent to the cut surfaces and improve the conductivity of the gasket.

* * * * *